United States Patent
Chien

(10) Patent No.: US 7,985,084 B2
(45) Date of Patent: Jul. 26, 2011

(54) ZIF SOCKET ASSEMBLY HAVING PICK-UP CAP ENGAGED WITH DRIVING CAM

(75) Inventor: Cheng-Ching Chien, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 54 days.

(21) Appl. No.: 12/578,529

(22) Filed: Oct. 13, 2009

(65) Prior Publication Data

US 2010/0093202 A1    Apr. 15, 2010

(30) Foreign Application Priority Data

Oct. 14, 2008    (TW) ................................ 097218289

(51) Int. Cl.
*H01R 13/44*    (2006.01)
(52) U.S. Cl. ........................................ 439/135; 439/940
(58) Field of Classification Search .................. 439/135, 439/940, 41, 331, 342
See application file for complete search history.

(56) References Cited

U.S. PATENT DOCUMENTS

| | | | |
|---|---|---|---|
| 6,609,926 B1 | 8/2003 | Chen et al. | |
| 6,846,190 B2 * | 1/2005 | Abe et al. | 439/135 |
| 7,114,977 B2 * | 10/2006 | Lei et al. | 439/342 |
| 7,147,508 B1 * | 12/2006 | Ju | 439/521 |
| 7,575,449 B1 * | 8/2009 | Cai | 439/135 |
| 7,794,261 B2 * | 9/2010 | Terhune et al. | 439/331 |
| 2004/0048495 A1 | 3/2004 | Lei et al. | |

* cited by examiner

*Primary Examiner* — Xuong M Chung Trans
(74) *Attorney, Agent, or Firm* — Andrew C. Cheng; Wei Te Chung; Ming Chieh Chang

(57) ABSTRACT

A zero insertion force (ZIF) socket assembly comprises a ZIF socket and a pick-up cap. The ZIF socket includes a base, a cover, and a cam assembled to the base and rotated for driving the cover to move relative to the base between an opened position and a closed position. The pick-up cap is mounted to the ZIF socket and has a lock-up abutting against the cam for preventing the cam from rotating.

11 Claims, 5 Drawing Sheets

ZIF SOCKET ASSEMBLY HAVING PICK-UP CAP ENGAGED WITH DRIVING CAM

BACKGROUND OF THE INVENTION

1. Field of the Invention

The present invention relates to a socket assembly, and more particularly to a zero insertion force (ZIF) socket assembly having a pick-up cap with a lock-up preventing a cam thereof from rotating during transportation.

2. Description of the Prior Art

A zero insertion force (ZIF) socket usually has a cam to drive a cover along a base such that a plurality of pins of an electronic package carried by the cover will contact with a plurality of contacts of the base of the ZIF socket. The use of the cam mechanism benefits a low-profile and weight of the socket. U.S. Pat. No. 6,609,926 issued to Chen et al. on Aug. 26, 2003, discloses a ZIF socket comprising a base with a plurality of contacts thereof and a cover with a plurality of through holes mounted to the base. A cam with a plurality of off-center-arranged shafts disposed between the base and the cover, for driving the cover to move along the base in a horizontal direction. The cam is rotated in a substantially 180 degrees such that a cam-shaft is to drive the cover to move between an opened position and a closed position. When the cover is located in the opened position, the electronic package can be readily mounted on the cover with pins extending through the cover and reach into passageways of the base; then the cam is rotated from one position to the other position to drive the cover to move to the closed position, making those inserted pins to engage with the contacts received in the passageways of the base. By this arrangement, the ZIF socket and the electronic package are established a reliable electrical connection therebetween. In addition, the ZIF socket further comprises a pick-up cap mounted upon the cover and picked up by a vacuum nozzle for placing the ZIF socket onto a printed circuit board.

Ideally, when the pin legs are inserted into the passageway through the through hole of cover which is positioned at the opened position, there should not have any contact between the pin leg and contact engaging arms disposed within the passageway. However, if the cover is moved and away from its opened position, the through hole of the cover may accidentally in align with the contact engaging arms. In this case, the insertion of the pin legs of the IC package will adversely damage the contact engaging arms.

Therefore, it is need to find a new ZIF socket to overcome the problems mentioned above.

SUMMARY OF THE INVENTION

Accordingly, an object of the present invention is to provide a ZIF socket assembly with a pick-up cap having a lock-up for engaging with a cam of the ZIF socket assembly to prevent the cam from being accidentally rotated till the pickup cap is removed.

In order to achieve the object set forth, a zero insertion force (ZIF) socket assembly comprises a ZIF socket. The ZIF socket comprises a base, a cover, and a cam assembled to the base and rotated for driving the cover to move relative to the base between an opened position and a closed position. A pick-up cap is mounted to the ZIF socket and has a lock-up abutting against the cam for preventing the cam from rotating.

In order to further achieve the object set forth, a ZIF socket assembly comprises a base with a plurality of contacts thereof. A cover is moveably mounted to the base having a plurality of through holes. A cam is mounted to the base and the cover and is rotated to drive the cover to displace a preset distance on the base. A pick-up cap has a planar main portion mounted upon the cover and a lock-up engaging with the cam for providing a resisting force to the cam.

DESCRIPTION OF PREFERRED EMBODIMENT

Reference will now be made to the drawings to describe the present invention in detail.

Figure 1:
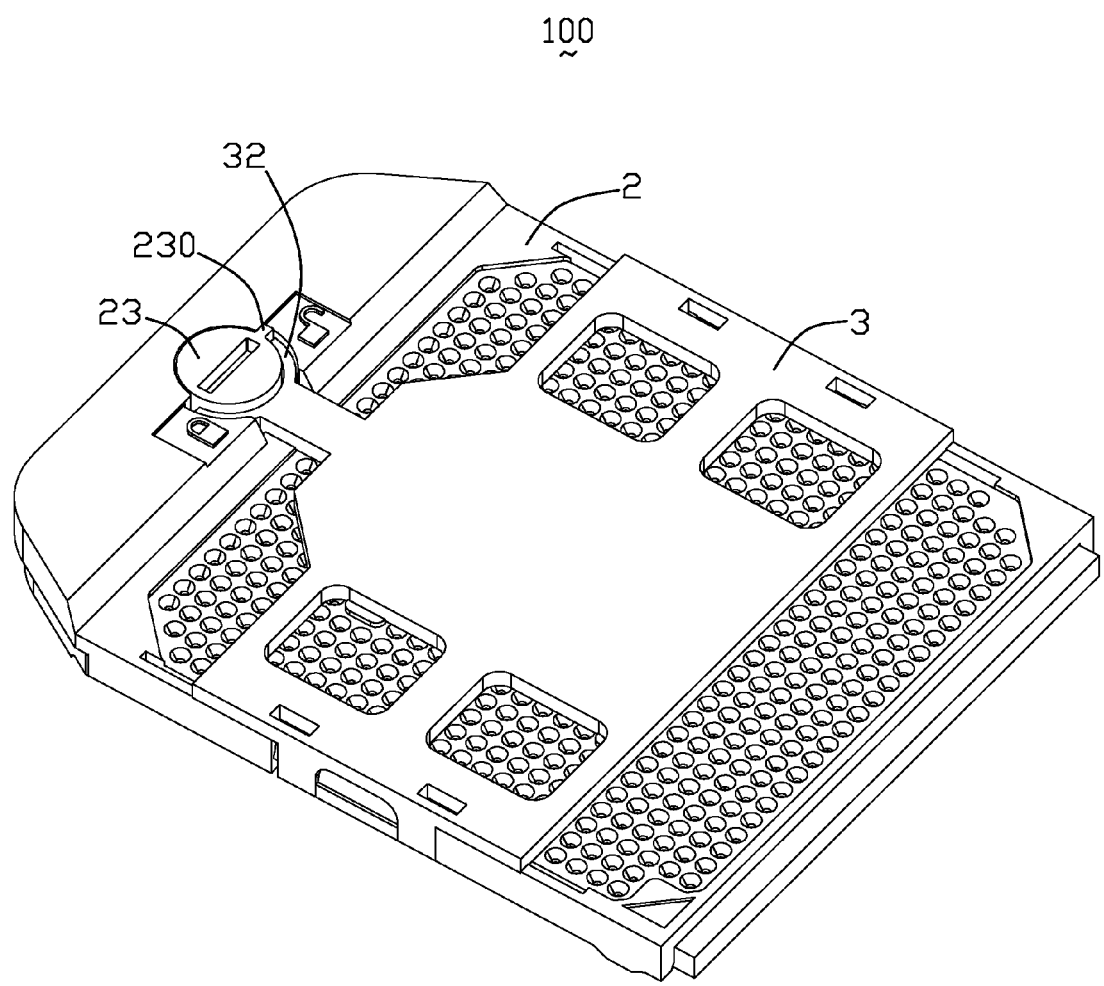
FIG. 1 is an assembled perspective view of a ZIF socket assembly according to the present invention.
Figure 2:
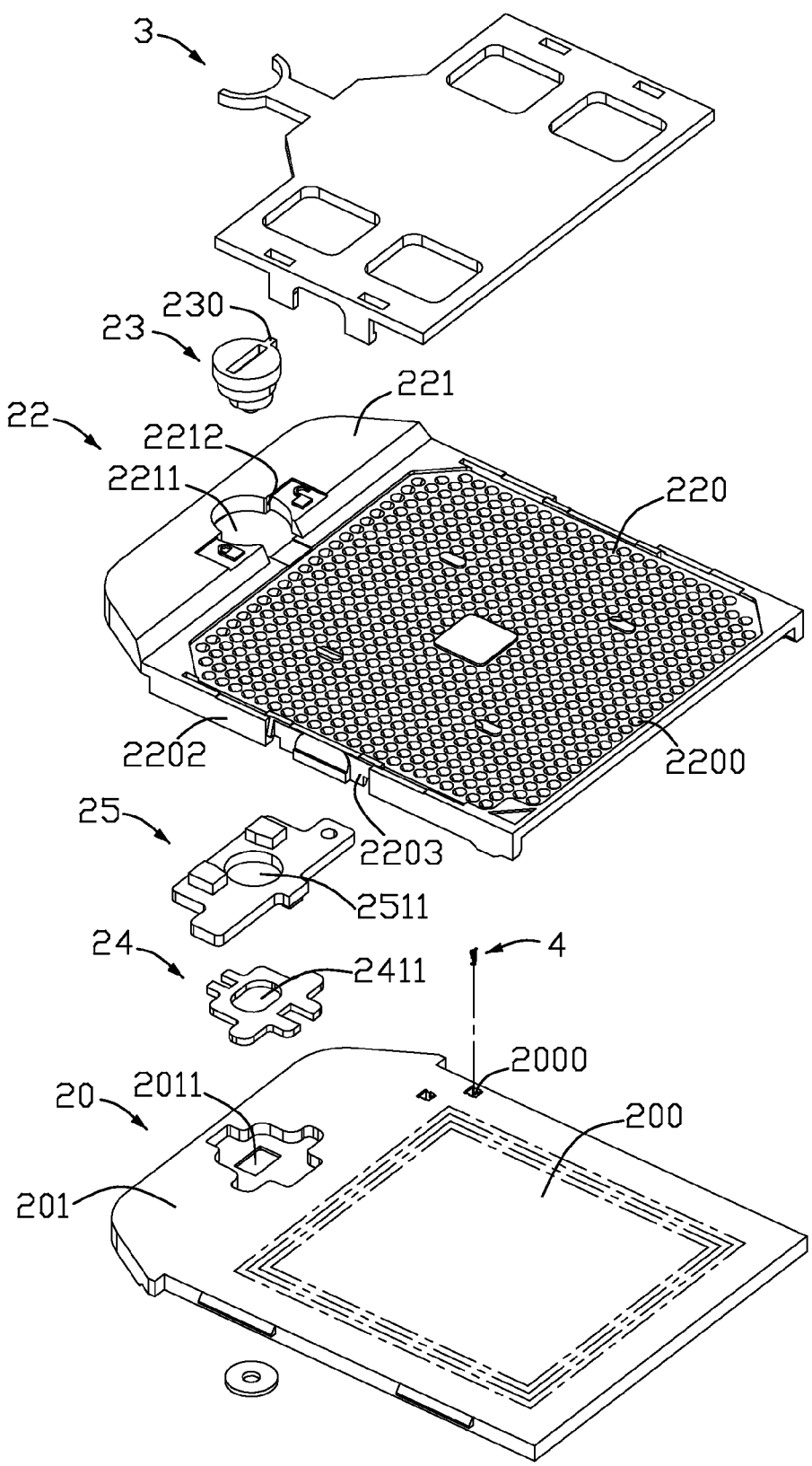
FIG. 2 is an exposed perspective view of the ZIF socket of the FIG. 1.
Figure 3:
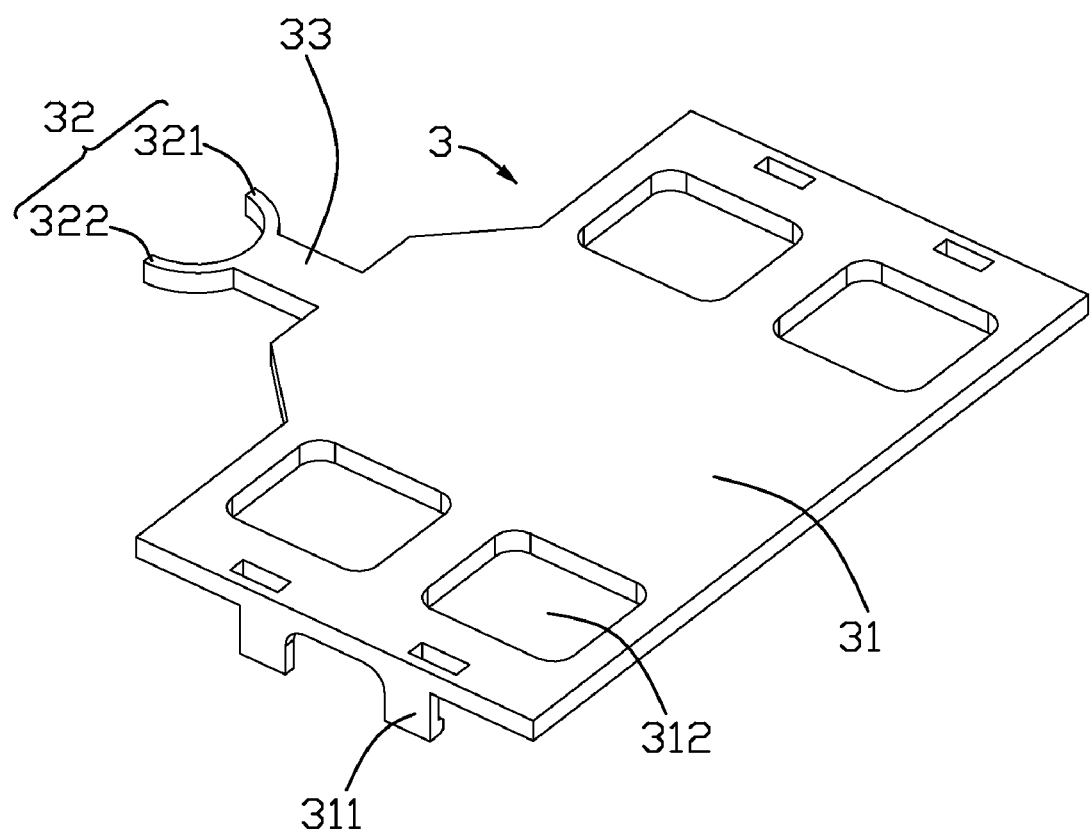
FIG. 3 is perspective view of a pick-up cap of the ZIF socket in the FIG. 2.

FIG. 1 to FIG. 3 show a zero insertion force (ZIF) socket assembly 100 comprises a ZIF socket 2 and a pick-up cap 3 mounted to the ZIF socket 2.

The ZIF socket 2 includes a base 20 having a plurality of contacts 4 and with a cover 22 mounted to the base 20. The base 20 has a substantially rectangular configuration and comprises a body portion 200 and a first end 201. A plurality of passageways 2000 are defined on the body portion 200 for receiving the contacts 4. The cover 22 includes a supporting portion 220 corresponding to the body portion 200 and a second end 221 corresponding to the first end 201. The supporting portion 220 has a plurality of through holes 2200 corresponding to the passageways 2000 and is lower than the second end 221. A pair of sidewalls 2202 extend from two opposite sides of the supporting portion 220 for leading the cover 22 to move relative to along the base 20 between an opened position and a closed position.

The base 20 has a supporting plate 24 assembled to a compartment of the first end 201 thereof, and correspondingly, the cover 22 has a striking plate 25 mounted to a bottom surface of the second end 221 thereof A number of shaft holes 2211, 2511, 2411, 2011 are defined on the cover 22, the striking plate 25, the supporting plate 24, and the base 20, respectively. The shaft hole 2211 of the cover 22 defines two single-steps 2212 on a side of the cover hole 2211.

The ZIF socket 2 further comprises a cam 23 inserted into the shaft holes 2211, 2511, 2411, 2011. The cam 23 includes a plurality of off-center eccentric shafts. A tab 230 is disposed on a top end of the cam 23 for engaging with the single-step 2212 of the cover 22. The tab 230 abuts against one of single-steps 2212 when the ZIF socket 2 is located in the opened position. Driving the cam 23 to rotate, the cover 22 moves relative to the base 20 till the tab 230 of the cam 23 abuts against the other single-step 2212 when the ZIF socket 2 is located in the closed position.

The pick-up cap 3 mounted upon the cover 22 comprises a planar main portion 31. The sidewalls 2202 of cover 22 have a plurality of recesses 2203, and the main portion 31 has four latches 311 extending downwardly to engage with the recesses 2203. The main portion 31 has a plurality of openings 312. A lock-up 32 reaches toward the cam 23 to prevent the cam 23 from rotating during transport.

Figure 4:
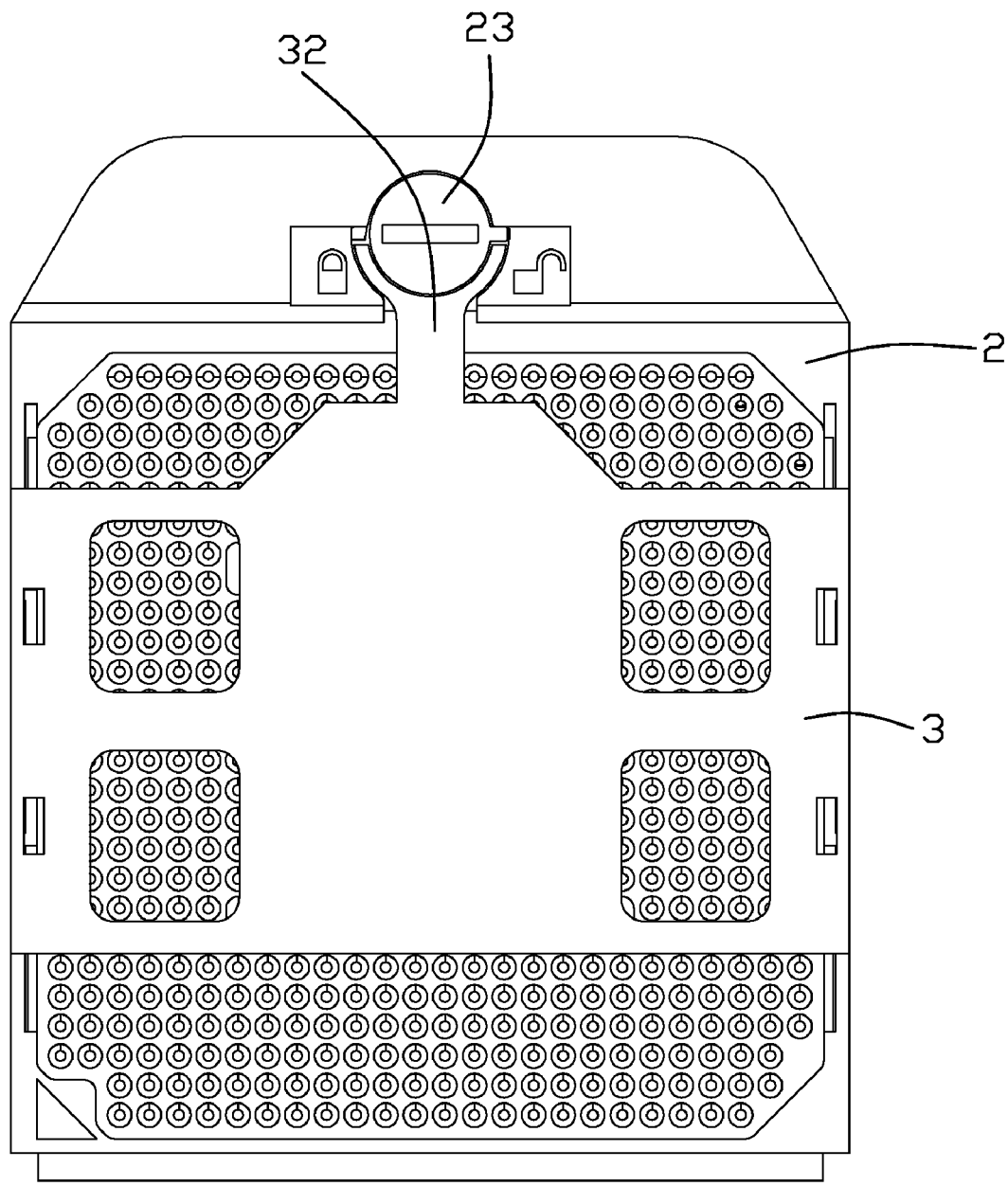
FIG. 4 is a top view of the ZIF socket of the FIG. 1.
Figure 5:
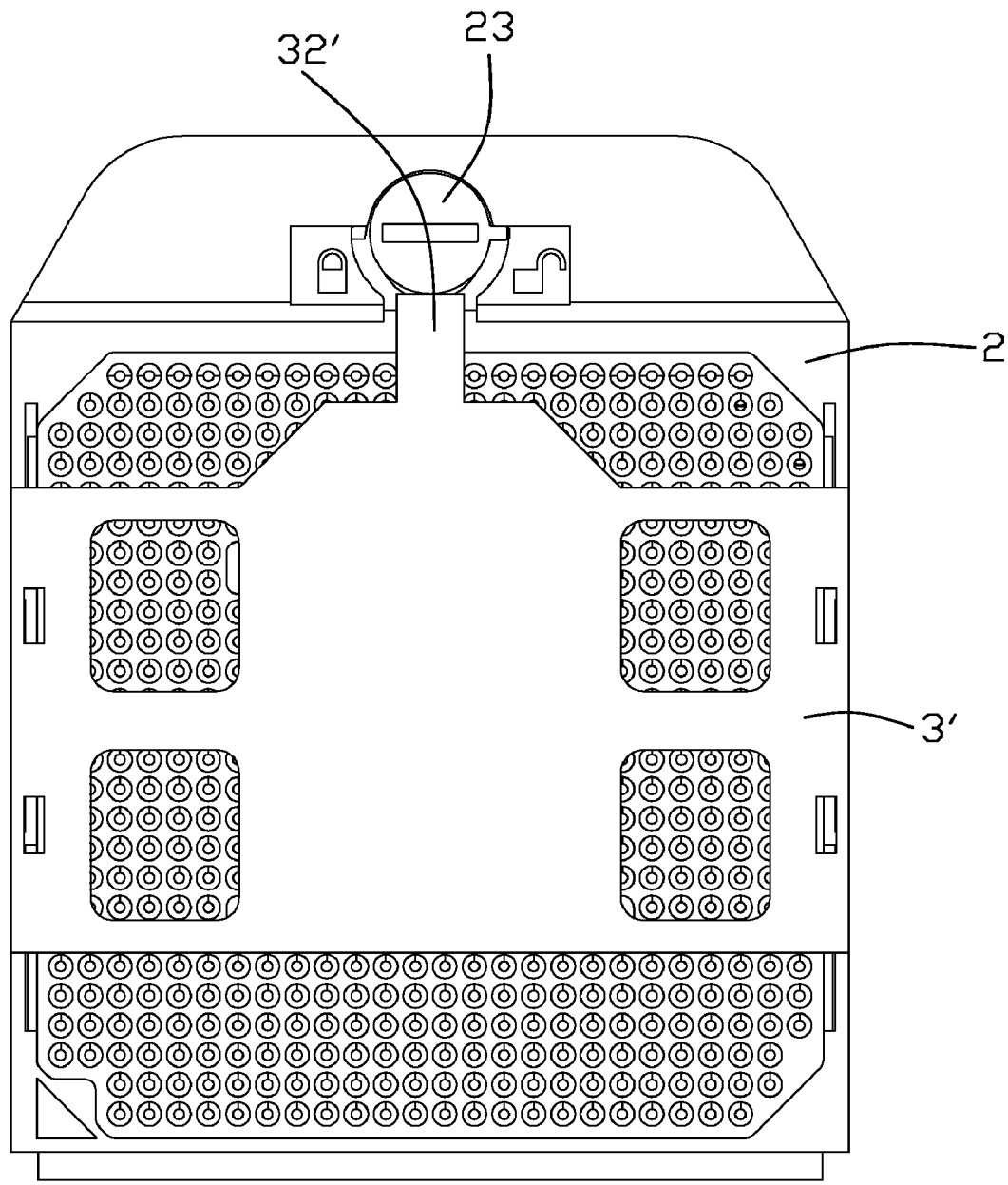
FIG. 5 is a top view of an alternative pick-up cap of the ZIF socket assembly.

Referring to FIG. 3, the lock-up 32 is formed like a substantially branch with a first and a second catches 321, 322 and a linking portion 33 extends from the main portion 31 and connects with the two catches 321, 322. The two catches 321, 322 are symmetrically arranged with respect to the linking portion 33. The first or the second catch 321 abuts against the tab 230 and orientates the tab 230 when the ZIF socket 2 is located in the opened position; if there is a need, the other catch 322 can abut against the tab 230 and orientate the tab 230 when the ZIF socket 2 is located in the closed position. FIG. 4 shows another embodiment of the pick-up cap of the present invention, a lock-up 32' of the pick-up cap 3' is configured with a rectangular configuration to abut directly against an edge of the cam 23. In the present invention, the lock-up 32 can be made to different configurations that can provide a force to the cam 23 to prevent the cam 23 from rotating.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A zero insertion force (ZIF) socket assembly comprising:
    a ZIF socket comprising a base, a cover, and a cam assembled to the base and rotatable for driving the cover to move relative to the base between an opened position and a closed position; and
    a pick-up cap mounted to the ZIF socket and having a lock-up abutting against an edge of the cam to provide a resisting force to prevent the cam from rotating; and wherein
    the cam comprises a plurality of off-center-arranged shafts.

2. The ZIF socket assembly as claimed in claim 1, wherein the pick-up cap includes a planar main portion and a plurality of latches extending downwardly from the main portion; and the cover has a plurality of recesses on sidewalls of the cover for engaging with the latches.

3. The ZIF socket assembly as claimed in claim 1, wherein the lock-up extends from the main portion.

4. The ZIF socket assembly as claimed in claim 1, wherein the lock-up is formed like a substantially branch with a first and a second catches and a linking portion extends from the main portion and connects with the first and the second catches.

5. The ZIF socket assembly as claimed in claim 4, wherein the first and the second catches are symmetrical about the linking portion, and the first or the second catch abuts against the tab of the cam when the ZIF socket located in the opened position.

6. The ZIF socket assembly as claimed in claim 1, wherein the cam further includes a tab disposed on a top edge thereof.

7. The ZIF socket assembly as claimed in claim 6, wherein the cover defines a shaft hole with two single-steps used to abut against the tab of the cam to control the rotating angle of the cam.

8. A ZIF socket assembly comprising:
    a base with a plurality of contacts thereof;
    a cover moveably mounted to the base having a plurality of through holes;
    a cam mounted to the base and the cover and rotated to drive the cover to displace a preset distance on the base; and
    a pick-up cap having a planar main portion mounted upon the cover and a lock-up engaging with the cam for providing a resisting force to the cam; and wherein
    the cover has two single-steps, and the cam has a tab extending therefrom, which can rotate to abut against the single-steps respectively; and wherein
    the tab engages with one of the single-steps when the ZIF socket assembly is located in an opened position, and engages with the other single step when the ZIF socket assembly is located in a closed position; and wherein
    the lock-up extends toward to the tab and abuts against the tab when the tab is located at the opened position.

9. The ZIF socket assembly as claimed in claim 8, wherein the lock-up includes a first and a second catches and a linking portion extending from the main portion to connect with the first and the second catches.

10. The ZIF socket assembly as claimed in claim 9, wherein the first or the second catch can orientate the tab at the opened position, and the other catch can orientate the tab at the closed position.

11. A ZIF socket connector, comprising:
    a base portion defining a plurality of passageways with a plurality of contact terminals disposed therein;
    a cover moveably assembled onto the base and defining a plurality of holes in align within the passageway;
    a cam mechanism rotationally rooted in the base and having a cam driving the cover; and
    a pickup cap attached to the socket and having a lockup engaged with the cam; and wherein
    the cover includes a track in which a positioning tab of the cover travels; and wherein
    the lockup is disposed within the track and has an end portion abutting against the positioning tab.

* * * * *